(12) United States Patent
Nakajima (10) Patent No.: US 6,557,152 B1
(45) Date of Patent: Apr. 29, 2003

(54) METHOD OF DESIGNING SIGNAL DISTRIBUTION CIRCUIT AND SYSTEM FOR SUPPORTING THE SAME

(75) Inventor: Kazuhiro Nakajima, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 211 days.

(21) Appl. No.: 09/691,787

(22) Filed: Oct. 19, 2000

(30) Foreign Application Priority Data

Oct. 22, 1999 (JP) .......................................... 11-300374

(51) Int. Cl.[7] .............................................. G06F 17/50
(52) U.S. Cl. ............................................................ 716/9
(58) Field of Search ...................................... 716/1–21

(56) References Cited

U.S. PATENT DOCUMENTS

| | | | | |
|---|---|---|---|---|
| 5,557,779 A | * | 9/1996 | Minami | 716/10 |
| 5,798,935 A | * | 8/1998 | Doreswamy et al. | 714/700 |
| 5,974,245 A | * | 10/1999 | Li et al. | 716/10 |
| 6,043,704 A | * | 3/2000 | Yoshitake | 327/295 |
| 6,053,950 A | * | 4/2000 | Shinagawa | 703/19 |
| 6,266,803 B1 | * | 7/2001 | Scherer et al. | 716/10 |
| 6,412,099 B1 | * | 6/2002 | Chiba | 716/12 |
| 2001/0010092 A1 | * | 7/2001 | Kato | 716/6 |

FOREIGN PATENT DOCUMENTS

| | | |
|---|---|---|
| JP | 7-98616 | 4/1995 |
| JP | 10-11494 | 1/1998 |
| JP | 10-163328 | 6/1998 |

* cited by examiner

*Primary Examiner*—Matthew Smith
*Assistant Examiner*—Andrea Liu
(74) *Attorney, Agent, or Firm*—Scully, Scott, Murphy & Presser (57) ABSTRACT

In a method of designing a signal distribution circuit, a plurality of circuit patterns of buffer circuits and patterns of wiring lines are arranged and connected to have a tree structure. A total delay time from an input of the buffer circuit in the highest layer of the tree structure to an output of each of the buffer circuits in the lowest layer of the tree structure is calculated. Each of the plurality of circuit patterns of the buffer circuits is selectively substituted by one of substitution patterns of substitution buffer circuits such that the total delay times fall within a predetermined range. All the outputs of the buffer circuits in the lowest layer of the tree structure are connected.

15 Claims, 6 Drawing Sheets

METHOD OF DESIGNING SIGNAL DISTRIBUTION CIRCUIT AND SYSTEM FOR SUPPORTING THE SAME

BACKGROUND OF THE INVENTION

1. Field of the Invention

The present invention relates to distribution of a clock signal in a tree structure of buffer circuits in which clock skew can be reduced.

2. Description of the Related Art

A clock tree structure is conventionally known in which circuit sections in a lower layer are located at an equal distance from a circuit section as a reference point to reduce clock skews in distributed clock signals. However, when the wiring lines between the circuit sections are formed to have fine patterns, 1the difference of the delays of a signal due to deviation in the resistance between the wiring lines cannot be ignored.

Figure 1:
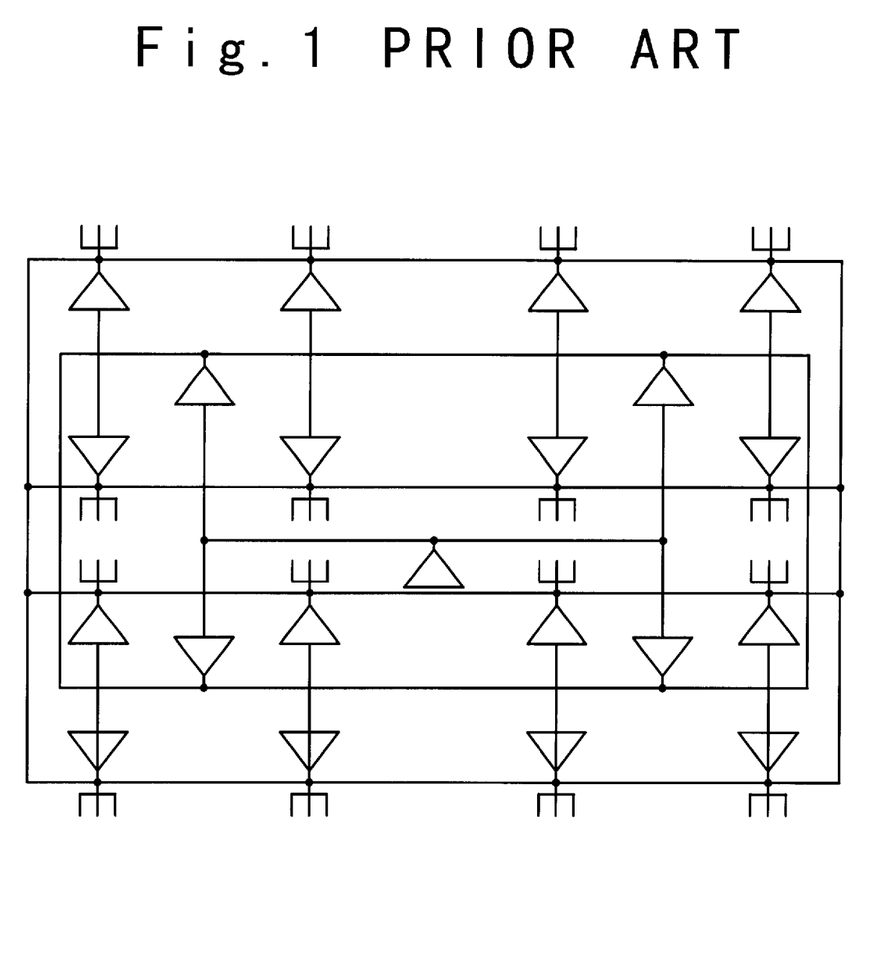
FIG. 1 is a circuit diagram showing the structure of a first conventional example of a tree structure of buffer circuits.

The technique to reduce clock skew is known in Japanese Laid Open Patent Application (JP-A-Heisei 7-98616). In this conventional example, the output terminals of the buffer circuits for every layer or every two or three layers are short-circuited, as shown in FIG. 1.

Figure 2:
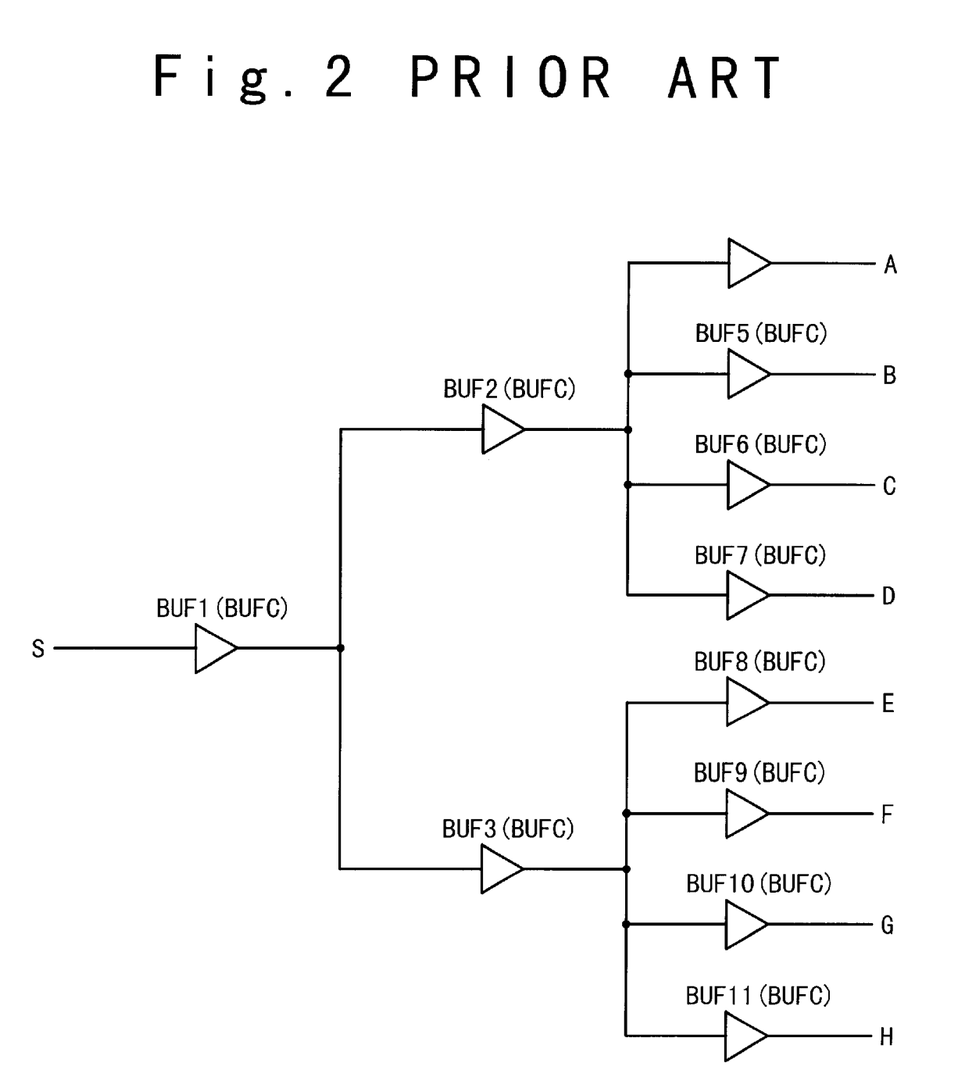
FIG. 2 is a circuit diagram showing the structure of a second conventional example of a tree structure of buffer circuits.

Another technique to reduce the clock skew is known in Japanese Laid Open Patent Application (JP-A-Heisei 10-11494). In this conventional example, one of buffer circuits in the tree structure is selectively substituted by another buffer. As a result, the delay times (propagation times) in the buffer circuits in a same layer of the tree structure are equalized. For example, as shown in FIG. 2, buffer circuits BUF3 and BUF11 are substituted by other buffer circuits which have different threshold values from the buffer circuits BUF3 and BUF11.

In case where the wiring lines are made fine, there is a limit in the first conventional example in which the delay time is adjusted through the substitution by another circuit with a different threshold value, if a clock signal with higher precision is required. Also, the second conventional example is not desired, because the wiring line becomes long for forming the short-circuit. When the clock skew is large, the effect of the short-circuit is not enough to reduce the clock skew. On contrary, the current flowing through the buffer circuit becomes large so that the possibility of erroneous operation due to noise increases. Also, the long wiring lines require a large chip area, so that the propagation time further increases.

In conjunction with the above description, a semiconductor integrated circuit is disclosed in Japanese Laid Open Patent Application (JP-A-Heisei 10-163328). In this reference, a clock driver circuit (14) is located in a macro cell arrangement region (9) in the center. The clock driver circuit (14) is composed of a plurality of predrivers (15) and main drivers (19). Input nodes and output nodes of the predrivers (15) are short-circuited by first and second common lines (16) and (18), and input nodes and output nodes of the main drivers (19) are short-circuited by second and third common lines (18) and (20). A plurality of clock driver circuits (21) are arranged in orthogonal to the clock driver circuit (14) with a predetermined interval. Each clock driver circuit (21) is composed of a plurality of predrivers (22) and main drivers (25). Input nodes and output nodes of the predrivers (22) are short-circuited by fourth and fifth common lines 23 and 24, and input nodes and output nodes of the main drivers (25) are short-circuited by fifth and sixth common lines (24) and (28). The third and fourth common lines (20) and (23) are connected. The sixth common line (28) is connected to a clock signal supply line (27) to which a plurality of second macro cell (26) is connected.

SUMMARY OF THE INVENTION

Therefore, an object of the present invention is to provide a method of designing a signal distributing circuit in a tree structure of buffer circuits, in which a clock skew can be minimized.

Another object of the present invention is to provide a method of designing a signal distributing circuit in a tree structure of buffer circuits, in which a design time can be reduced.

Still another object of the present invention is to provide a method of designing a signal distributing circuit in a tree structure of buffer circuits, in which clock skew can be minimized while degradation of a clock signal can be prevented.

Yet still another object of the present invention is to provide a method of designing a signal distributing circuit in a tree structure of buffer circuits, in which a chip size can be reduced.

In an aspect of the present invention, a method of designing a signal distribution circuit, is attained by arranging and connecting a plurality of circuit patterns of buffer circuits and patterns of wiring lines to have a tree structure; by calculating a total delay time from an input of the buffer circuit in the highest layer of the tree structure to an output of each of the buffer circuits in the lowest layer of the tree structure; by selectively substituting each of the plurality of circuit patterns of the buffer circuits by one of substitution patterns of substitution buffer circuits such that the total delay times fall within a predetermined range; and by connecting all the outputs of the buffer circuits in the lowest layer of the tree structure.

It is desirable that the substitution buffer circuits have different delay times. In this case, the substitution may be attained by calculating an average of the total delay times; by determining whether a difference between each of the total delay times and the calculated average falls within a predetermined range; and by selectively substituting each of the buffer circuits in the lowest layer by one of the substitution buffer circuits based on the difference between the total delay time related to the buffer circuit and the calculated average, when the difference between the total delay time of the buffer circuit and the calculated average falls within the predetermined range.

Further, the substitution may be attained by substituting the buffer circuit in an upper layer of the tree structure related to the total delay time which does not fall within the predetermined range, by one of the substitution buffer circuits based on the difference between the total delay time and the calculated average. In this case, the substitution may further includes: selectively substituting each of the buffer circuits in the lowest layer by one of the substitution buffer circuits based on the difference between the total delay time related to the buffer circuit and the calculated average, and a difference between a delay time of the buffer circuit in the upper layer and a delay time of the substitution buffer circuit for the buffer circuit in the upper layer.

In order to achieve another aspect of the present invention, a design supporting system for a signal distributing circuit, includes a display unit, a memory which stores substitution patterns of substitution buffer circuits, and a processor. The processor controls the display unit to arrange and connect circuit patterns of a plurality of buffer circuits and patterns of wiring lines to have a tree structure. Also, the processor calculates a total delay time from an input of the buffer circuit in the highest layer of the tree structure to an output of each of the buffer circuits in the lowest layer of the tree structure. Further, the processor selectively substitutes each of the plurality of circuit patterns of the buffer circuits by one of substitution patterns of substitution buffer circuits such that the total delay times fall within a predetermined range, and connects all the outputs of the buffer circuits in the lowest layer of the tree structure.

It is desirable that the substitution buffer circuits have different delay times. In this case, the processor may calculate an average of the total delay times, and determines whether a difference between each of the total delay times and the calculated average falls within a predetermined range. Also, the processor may selectively substitute each of the buffer circuits in the lowest layer by one of the substitution buffer circuits based on the difference between the total delay time related to the buffer circuit and the calculated average, when the difference between the total delay time of the buffer circuit and the calculated average falls within the predetermined range. Also, the processor may further substitute the buffer circuit in an upper layer of the tree structure related to the total delay time which does not fall within the predetermined range, by one of the substitution buffer circuits based on the difference between the total delay time and the calculated average. In addition, the processor may further selectively substitute each of the buffer circuits in the lowest layer by one of the substitution buffer circuits based on the difference between the total delay time related to the buffer circuit and the calculated average, and a difference between a delay time of the buffer circuit in the upper layer and a delay time of the substitution buffer circuit for the buffer circuit in the upper layer.

In order to achieve still another aspect of the present invention, a recording medium may store a program for any one of the above methods of designing a signal distribution circuit.

DESCRIPTION OF THE PREFERRED EMBODIMENTS

Hereinafter, a tree structure of buffer circuits as a clock signal distributing circuit of the present invention will be described below in detail with reference to the attached drawings.

Figure 3:
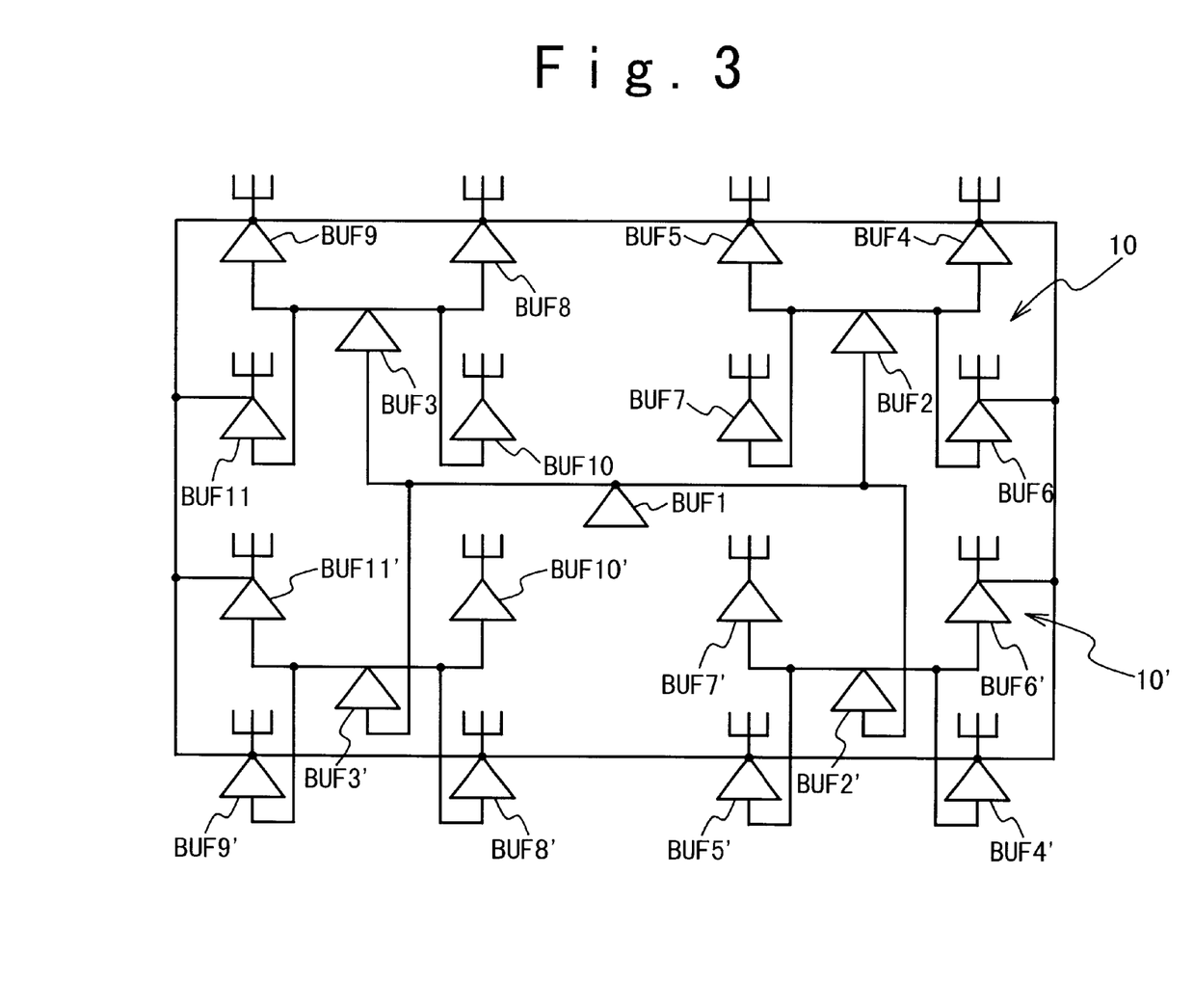
FIG. 3 is a circuit diagram showing the structure of a tree structure of buffer circuits according to an embodiment of the present invention.

FIG. 3 is a circuit diagram showing the structure of the clock signal distributing circuit according to an embodiment of the present invention. In the clock signal distributing circuit, two circuit sections 10 and 10' are provided in parallel to have same three structures. One 10 of the circuit sections is composed of 11 buffer circuits BUF1 to BUF11. The other circuit section 10' is composed of 11 buffer circuits BUF1' to BUF11'. The buffer circuit BUF1 is identical to the buffer circuit BUF1 as a route buffer circuit.

The buffer circuits BUF2 and BUF3 are connected with the buffer circuit BUF1 by two branching wiring lines extending from the output terminal of the buffer circuit BUF1. The distance from the buffer circuit BUF1 to the buffer circuit BUF2 is not always equal to the distance from the buffer circuit BUF1 to the buffer circuit BUF3. In this case, the equal distance means that the wiring line lengths are equal to each other. Therefore, the wiring line length between the buffer circuit BUF2 and the buffer circuit BUF1 is not always equal to the wiring line length between the buffer circuit BUF3 and the buffer circuit BUF1.

The buffer circuit BUF1 is a single buffer circuit as a route layer of the tree structure. The buffer circuits BUF2 and BUF3 belong to the second layer lower than the route layer. The third layer is separated into two groups. The buffer circuits BUF4 to BUF7 belongs to the one group, and the buffer circuits BUF8 to BUF11 belong to the other group. The four buffer circuits BUF4 to BUF7 are not always arranged at the equal distance from the buffer circuit BUF2. The four buffer circuits BUF8 to BUF11 are not always arranged at the equal distance from the buffer circuit BUF3. The two groups are not always spatially symmetrically arranged with respect to a reference line which passes through the buffer circuit BUF1. The buffer circuits BUF4 to BUF7 are not always arranged in the point symmetry to the buffer circuit BUF2. The buffer circuits BUF8 to BUF11 are not always arranged in the point symmetry to the buffer circuit BUF3. The buffer circuits BUF2' to BUF11' is not always spatially symmetrically arranged with the buffer circuits BUF2 to BUF11 to another reference line which passes through the buffer circuit BUF1. The distance between the buffer circuit BUF1 and the buffer circuit BUFN (N is either of 2 to 11) is not always equal to the distance between the buffer circuit BUF1 and the buffer circuit BUFN' (N' is either of 2' to 11') even if N=N'. The distance between the buffer circuit BUF2 and the buffer circuit BUFN (N is either of 4 to 7) is not always equal to the distance between the buffer circuit BUF2 and the buffer circuit BUFM (M is either of 4 to 7) even if N=M. The distance between the buffer circuit BUF2 and the buffer circuit BUFN (N is either of 5 to 11) is not always equal to the distance between the buffer circuit BUF2 and the buffer circuit BUFM (M is either of 8 to 11) even if N=M.

Even if all the buffer circuits BUF1 to BUF11 and BUF1' to BUF11' having the above arrangement and wiring line structure have the same physical constants such as a rising time, a falling time, a delay time, and an amplitude of output, and even if the physical constants such as a line width of a resistance over all the wiring lines are the same, the signal propagation times to all the buffer circuits which belong to the same layer from route buffer circuit BUF1 are not always the same. Also, even if the physical operation constants of all the buffer circuits and the arrangement and structure of wiring lines are the same, the delay times are not always the same. Actually, the deviation of the delay times is present.

In the present invention, five different substitution buffer circuits A to E are provided for all the buffer circuits BUF1 to BUF11, and BUF1' to BUF11' as follows:

The substitution buffer circuit A: has the delay time of −0.2 ns (The delay time with respect to the buffer circuit C is −0.2 ns);

The substitution buffer circuit B: has the delay time of −0.1 ns (The delay time with respect to the buffer circuit C is −0.1 ns);

The substitution buffer circuit C: has the delay time of −0.0 ns;

The substitution buffer circuit D: has the delay time of +0.1 ns (The delay time with respect to the buffer circuit C is +0.1 ns); and The substitution buffer circuit E: has the delay time of +0.2 ns (The delay time with respect to the buffer circuit C is +0.2 ns).

Next, the method of designing a clock signal distribution circuit of buffer circuits in a tree structure will be described below.

<Step 1>

Figure 4:
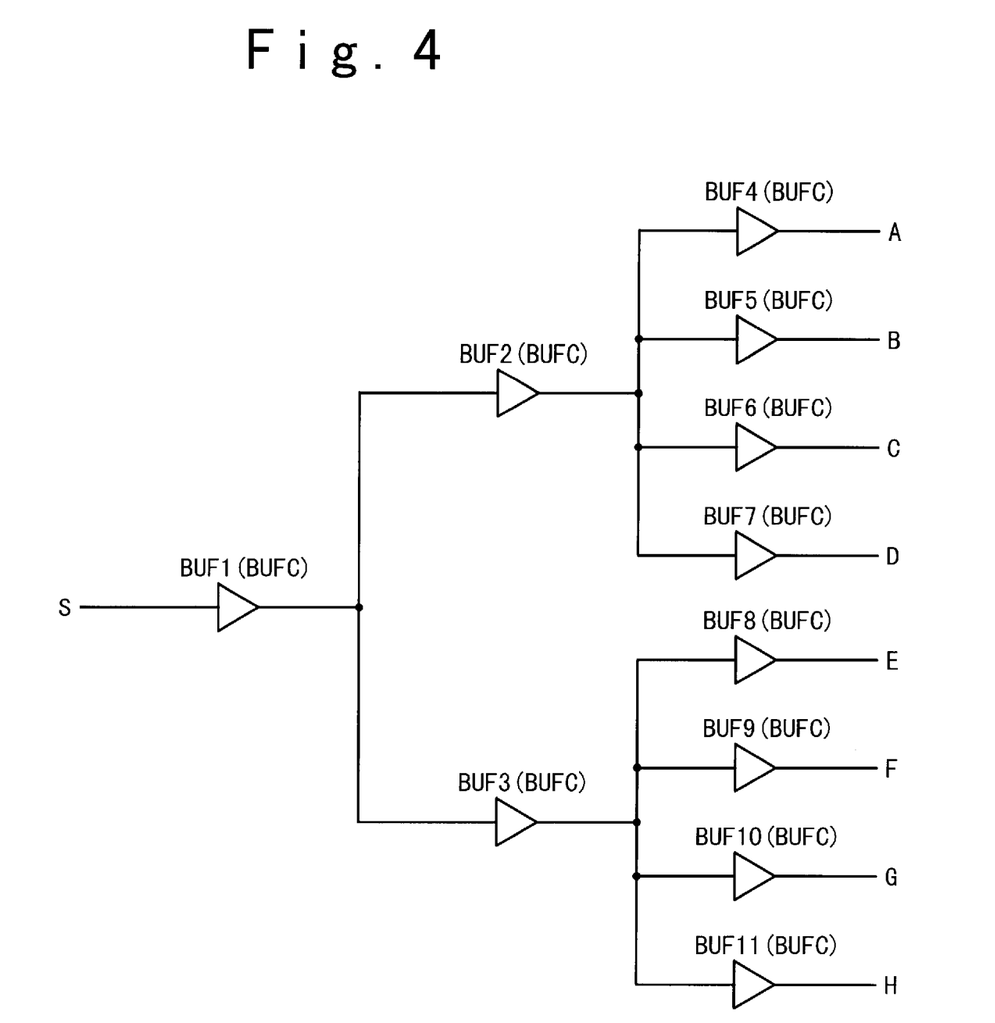
FIG. 4 is a circuit diagram showing an equivalent circuit of the tree structure of buffer circuits shown in FIG. 3.

The patterns of the buffer circuits are arranged and connected by wiring line patters. FIG. 4 shows the connection relation of the buffer circuits shown in FIG. 3. In FIG. 4, an input terminal of the route buffer circuit BUF1 is shown as S, and the output terminal of each of the buffer circuits BUF4 to BUF11 in the third layer of the tree structure is shown as A, B, C, . . . , G, and H. The buffer circuit BUFC is commonly allocated to the buffer circuit BUF1 to BUF11 in the first design stage.

<Step 2>

From the arrangement relation in the tree structure in this first design stage, the deviation of the propagation times or delay times of a clock signal propagated from the buffer circuit BUF1 to the buffer circuits BUF4 to BUF11 via the buffer circuits BUF2 and BUF3 are estimated. The estimation result is as follows:

The delay time of S→A: 1.2 ns
The delay time of S→B: 1.3 ns
The delay time of S→C: 1.4 ns
The delay time of S→D: 1.2 ns
The delay time of S→E: 1.1 ns
The delay time of S→F: 1.0 ns
The delay time of S→G: 0.9 ns
The delay time of S→H: 1.2 ns <Step 3>

In the design supporting apparatus, an average of the delay times in the routes S→A, . . . , S→H is calculated, and set as a refernce delay time. The delay time of 1.2 ns in the routes S→A and S→D is near to the reference delay time. In this example, the delay times in the routes S→A and S→D are equal to the reference delay time. Therefore, substitution is not carried out to the buffer circuits BUF4 and BUF7. If the substitution buffer circuit A or E of the group of substitution buffer circuits A to E is substituted for the buffer circuit C, it is possible to adjust the delay of ±0.2 ns.

<Step 4: Substitution 1>

The buffer circuit BUF5 (the buffer circuit BUFC) in the route S→B in which the delay time is longer than the reference delay time by +0.1 ns is substituted by the buffer circuit B which has the delay time of −0.1 ns. Thus, the delay time in the route S→B is coincident with 1.2 ns of the reference delay time. <Step 5: Substitution 2>

The buffer circuit BUF6 (the buffer circuit BUFC) in the route S→C in which the delay time is longer than the reference delay time by +0.2 ns is substituted by the buffer circuit A which has the delay time of −0.2 ns. Thus, the delay time in the route S→C is coincident with 1.2 ns of the reference delay time.

<Step 6: Substitution 3>

The delay time in the route S→G is 0.9 ns. Therefore, even if the buffer circuit BUF10 in the route S→G is substituted by any in the group of the buffer circuits A to E, the delay time in the route S→G never becomes 1.2 ns. In this case, the buffer circuit BUF3 (the buffer circuit BUFC) in the second layer is substituted. The buffer circuit BUF3 (the buffer circuit BUFC) is substituted by the buffer circuit E which has the delay time of +0.2 ns with respect to the buffer circuit BUFC. Through the substitution of the buffer circuit BUF3 (the buffer circuit BUFC) to the buffer circuit E, the substitution for the buffer circuit BUF9 (the buffer circuit BUFC) in the route S→F which has the delay time of −0.2 ns with respect to the reference delay time is not necessary.

<Step 7: Substitution 4>

The buffer circuit BUF8 (the buffer circuit BUFC) in the route S→E with the delay time of +0.1 ns with respect to the reference delay time is substituted by the buffer circuit B which has the delay time of −0.1 ns with respect to the buffer circuit BUFC. As a result, the delay time in the route S→E is coincident with 1.2 ns of the reference delay time.

<Step 8: Substitution 5>

The buffer circuit BUF10 (the buffer circuit BUFC) in the route S→G which had the delay time of −0.3 ns with reference delay time is substituted by the buffer circuit D which has the delay time of +0.1 ns with respect to the buffer circuit BUFC. Thus, the delay time in the route S→G becomes equal to 1.2 ns of the reference delay time.

<Step 9: Substitution 6>

The buffer circuit BUF11 (the buffer circuit BUFC) in the route S→H which had the delay time equal to the reference delay time is substituted by the buffer circuit A which has the delay time of −0.2 ns with respect to the buffer circuit BUFC. Thus, the delay time in the route S→H becomes equal to 1.2 ns of the reference delay time.

Figure 5:
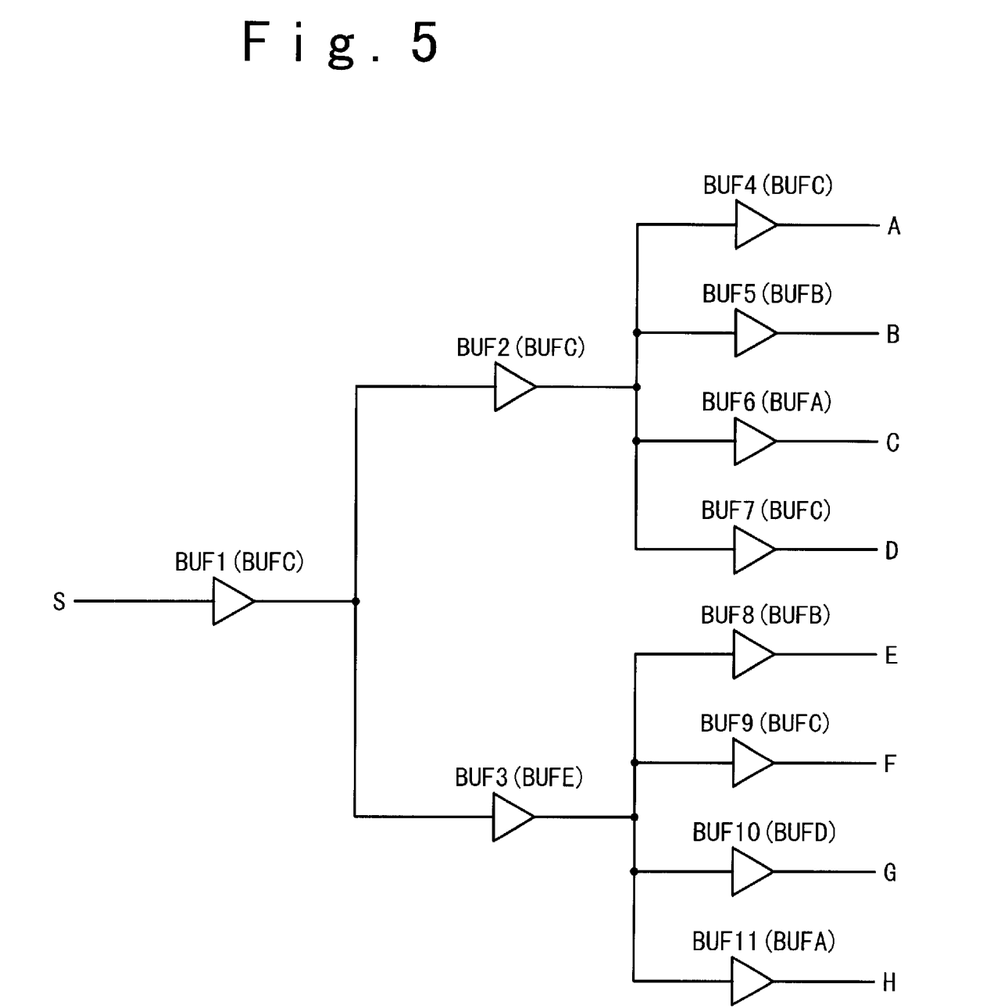
FIG. 5 is a circuit diagram showing the tree structure of buffer circuits after substitution.

The tree structure of the buffer circuits obtained through the substitutions 1 to 6 is as shown in FIG. 5. All the clock signals outputted from all the output terminals of the buffer circuits BUF4 to BUF11 in the third layer of this tree structure are synchronized with each other in the precision of 0.0 ns.

<Step 10>

Next, all the outputs of the buffer circuits BUF4 to BUF11 in the third layer of the tree structure are connected to form a short-circuit.

In the above example, all the outputs of the buffer circuits in the lowest layer are connected. However, a part of the outputs of the buffer circuits in the lowest layer may be connected. In this case, it is not always possible to determine the most suitable short-circuit wiring through the above process composed of only the plurality of steps. A total wiring line length when some buffer circuits in the lowest layer are substituted and the short-circuit wiring is carried out is compared with a total wiring line when some buffer circuits in the lower layer are substituted after some of the buffer circuits in the higher layer are substituted and the short-circuit wiring is carried out when the delay times cannot be made equal to each other. Thus, a combination of the substitution and the short-circuit wiring in which the total wiring line length is shortest may be determined.

In this way, the difference between the delay times of the clock signals outputted from the output terminals of the buffer circuits in the lowest layer is properly designed to be small initially. The short-circuit wiring is formed in the part or whole the buffer circuits in only the lowest layer. Through the formation of such a short-circuit wiring, the total wiring line lengths is made short and the wiring line resistance is made small. At the same time, the deviation of the clock skew is decreased in the preliminary design stage. When the deviation is large, the reduction of the clock skew cannot be attained to an expected degree through the formation of the short-circuit wiring. However, when the wiring line resistance is short, and the deviation of the clock skew is small, the formation of the short-circuit wiring between the specific buffer circuits in the lowest layer of the tree structure is effective.

On the other hand, the formation of the short-circuit wiring between the buffer circuit in the higher layer has less effect in the reduction of the clock skew. The substitution of the buffer circuit in the higher layer reduces the deviation of the delay times between the buffer circuits in the lowest layer so that the influence of the buffer circuit in the higher layer to the buffer circuit in the lower layer can be made less.

Figure 6:
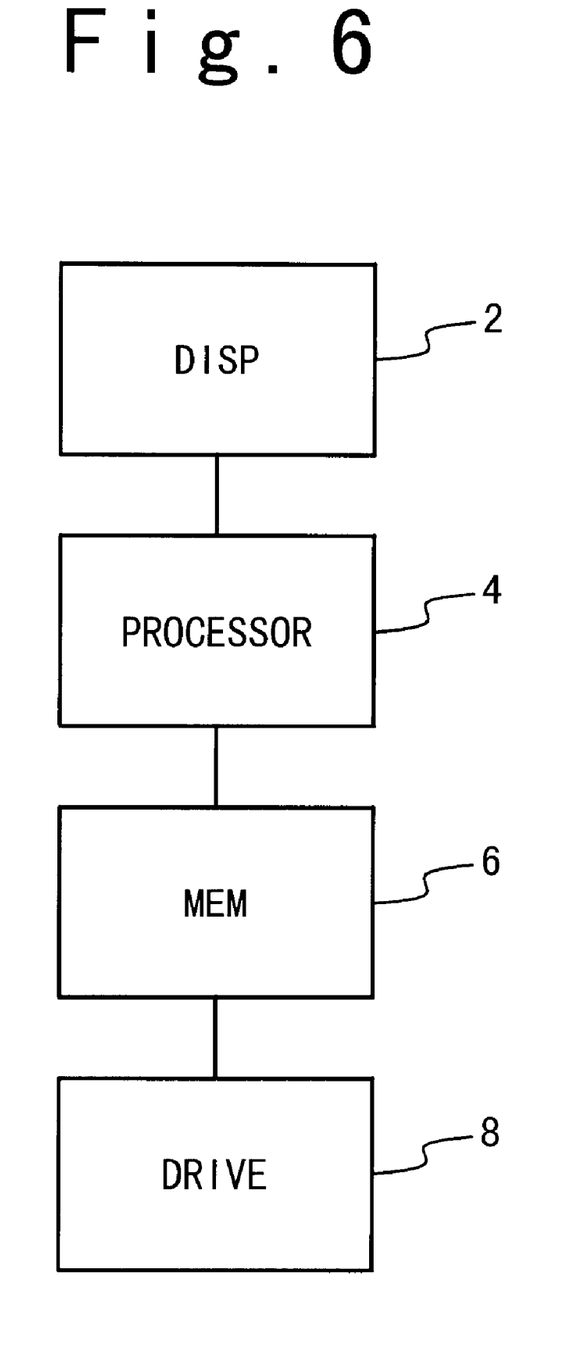
FIG. 6 is a block diagram showing a design supporting system of the present invention.

Next, FIG. 6 shows a design supporting system of the present invention. The design supporting system is composed of a display unit 2, a processor 4, a memory 6 and drive unit 8. The drive unit 8 reads a recording medium in which a program is recorded for the above-mentioned method and stores in the memory 6. Also, the memory 6 stores the patterns of a group of substitution buffer circuits. The processor 4 executes the program to carry out the above-mentioned steps 1 to 10. The design result is displayed on the display unit 2.

As described above, according to the tree structure of the buffer circuits of the present invention, the wiring line resistance is small. The formation of the short-circuit wiring between the specific buffer circuits in the lowest layer of the tree structure where the deviation of the clock skew is small is effective in the reduction effect of the clock skew. As a result, the increase of the chip area can be restrained while preventing the degradation of the clock signals.

Also, the buffer circuit in the higher layer is substituted only when the deviation of the delay times cannot be made small through only the substitution of the buffer circuits in the lowest layer. Thus, the increase of the wiring line length through the substitution of the buffer circuits can be restrained and the formation of the short-circuit wiring between the buffer circuits in the higher layer can be prevented.

What is claimed is:

1. A method of designing a signal distribution circuit, comprising:
   arranging and connecting a plurality of circuit patterns of buffer circuits and patterns of wiring lines to have a tree structure;
   calculating a total delay time from an input of said buffer circuit in the highest layer of said tree structure to an output of each of said buffer circuits in the lowest layer of said tree structure;
   selectively substituting each of said plurality of circuit patterns of said buffer circuits by one of substitution patterns of substitution buffer circuits such that said total delay times fall within a predetermined range; and
   connecting all the outputs of said buffer circuits in the lowest layer of said tree structure.

2. The method according to claim 1, wherein said substitution buffer circuits have different delay times.

3. The method according to claim 2, wherein said selectively substituting includes:
   calculating an average of said total delay times;
   determining whether a difference between each of said total delay times and said calculated average falls within a predetermined range; and
   selectively substituting each of said buffer circuits in the lowest layer by one of said substitution buffer circuits based on the difference between said total delay time related to said buffer circuit and said calculated average, when the difference between said total delay time of said buffer circuit and said calculated average falls within the predetermined range.

4. The method according to claim 3, wherein said selectively substituting further includes:
   substituting said buffer circuit in an upper layer of said tree structure related to said total delay time which does not fall within the predetermined range, by one of said substitution buffer circuits based on the difference between said total delay time and said calculated average.

5. The method according to claim 4, wherein said selectively substituting further includes:
   selectively substituting each of said buffer circuits in the lowest layer by one of said substitution buffer circuits based on the difference between said total delay time related to said buffer circuit and said calculated average, and a difference between a delay time of said buffer circuit in the upper layer and a delay time of said substitution buffer circuit for said buffer circuit in the upper layer.

6. A design supporting system for a signal distributing circuit, comprising:
   a display unit;
   a memory which stores substitution patterns of substitution buffer circuits; and
   a processor which:
      controls said display unit to arrange and connect circuit patterns of a plurality of buffer circuits and patterns of wiring lines to have a tree structure,
      calculates a total delay time from an input of said buffer circuit in the highest layer of said tree structure to an output of each of said buffer circuits in the lowest layer of said tree structure,
      selectively substitutes each of said plurality of circuit patterns of said buffer circuits by one of substitution patterns of substitution buffer circuits such that said total delay times fall within a predetermined range, and
      connects all the outputs of said buffer circuits in the lowest layer of said tree structure.

7. The design supporting system according to claim 6, wherein said substitution buffer circuits have different delay times.

8. The design supporting system according to claim 7, wherein said processor:
   calculates an average of said total delay times;
   determines whether a difference between each of said total delay times and said calculated average falls within a predetermined range; and
   selectively substitutes each of said buffer circuits in the lowest layer by one of said substitution buffer circuits based on the difference between said total delay time related to said buffer circuit and said calculated average, when the difference between said total delay time of said buffer circuit and said calculated average falls within the predetermined range.

9. The design supporting system according to claim 8, wherein said processor further:
   substitutes said buffer circuit in an upper layer of said tree structure related to said total delay time which does not fall within the predetermined range, by one of said substitution buffer circuits based on the difference between said total delay time and said calculated average.

10. The design supporting system according to claim 9, wherein said processor further:

selectively substitutes each of said buffer circuits in the lowest layer by one of said substitution buffer circuits based on the difference between said total delay time related to said buffer circuit and said calculated average, and a difference between a delay time of said buffer circuit in the upper layer and a delay time of said substitution buffer circuit for said buffer circuit in the upper layer.

11. A recording medium in which a program is recorded for a method of designing a signal distribution circuit, wherein said method comprises:

arranging and connecting a plurality of circuit patterns of buffer circuits and patterns of wiring lines to have a tree structure;

calculating a total delay time from an input of said buffer circuit in the highest layer of said tree structure to an output of each of said buffer circuits in the lowest layer of said tree structure;

selectively substituting each of said plurality of circuit patterns of said buffer circuits by one of substitution patterns of substitution buffer circuits such that said total delay times fall within a predetermined range; and connecting all the outputs of said buffer circuits in the lowest layer of said tree structure.

12. The recording medium according to claim 11, wherein said substitution buffer circuits have different delay times.

13. The recording medium according to claim 12, wherein said selectively substituting includes:

calculating an average of said total delay times;

determining whether a difference between each of said total delay times and said calculated average falls within a predetermined range; and selectively substituting each of said buffer circuits in the lowest layer by one of said substitution buffer circuits based on the difference between said total delay time related to said buffer circuit and said calculated average, when the difference between said total delay time of said buffer circuit and said calculated average falls within the predetermined range.

14. The recording medium according to claim 13, wherein said selectively substituting further includes:

substituting said buffer circuit in an upper layer of said tree structure related to said total delay time which does not fall within the predetermined range, by one of said substitution buffer circuits based on the difference between said total delay time and said calculated average.

15. The recording medium according to claim 14, wherein said selectively substituting further includes:

selectively substituting each of said buffer circuits in the lowest layer by one of said substitution buffer circuits based on the difference between said total delay time related to said buffer circuit and said calculated average, and a difference between a delay time of said buffer circuit in the upper layer and a delay time of said substitution buffer circuit for said buffer circuit in the upper layer.

* * * * *